United States Patent [19]

Hee et al.

[11] Patent Number: 5,646,967

[45] Date of Patent: Jul. 8, 1997

[54] MULTI-PHASE TRIANGULAR WAVE SYNTHESIZER FOR PHASE-TO-FREQUENCY CONVERTER

[75] Inventors: Wong Hee, San Jose; Gabriel Li, San Francisco, both of Calif.

[73] Assignee: National Semiconductor Corporation, Santa Clara, Calif.

[21] Appl. No.: 644,035

[22] Filed: May 9, 1996

[51] Int. Cl.$^6$ ................................................. H04L 7/00
[52] U.S. Cl. ................................... 375/373; 375/374
[58] Field of Search .............................. 375/373, 374, 375/375; 328/141; 324/160; 327/131

[56] References Cited

U.S. PATENT DOCUMENTS 5,056,054 10/1991 Wong et al. ........................... 375/373
5,224,125 6/1993 Wong et al. ........................... 375/373

Primary Examiner—Tesfaldet Bocure
Attorney, Agent, or Firm—Limbach & Limbach L.L.P.

[57] ABSTRACT

A triangular waveform synthesizer for a phase-to-frequency converter generates a saw tooth and triangular wave using both PDM and a DC modulation scheme. To minimize both delay and logic, while continuing to provide reasonable resolution, a 4-bit PDM and associated logic generates the PDM output waveform with polarity information and two switching waveforms that encode the DC level information to provide a resultant sum. The resulting waveform, after filtering, is the triangular waveform. Since the switching and adding of the DC levels occurs in real time, the actual delay for the resultant triangular wave is only that of the 4-bit PDM.

4 Claims, 6 Drawing Sheets

MULTI-PHASE TRIANGULAR WAVE SYNTHESIZER FOR PHASE-TO-FREQUENCY CONVERTER

RELATED APPLICATION

This application is related to commonly-assigned application Ser. No. 08/644,036, filed May 9, 1996, titled "A THIRD HARMONIC SUPPRESSION SCHEME FOR A WAVE USED IN A PHASE-TO-FREQUENCY CONVERTER", which application is hereby incorporated by reference in its entirety to provide additional background information regarding the present invention.

BACKGROUND OF THE INVENTION

1. Field of the Invention

The present invention relates to very high frequency phase locked loops (PLLs) and, in particular, to a triangular wave synthesizer that uses a single saw tooth counter to create multiple phase triangular waveforms at greater than original amplitude.

2. Discussion of the Related Art

Commonly-assigned U.S. Pat. No. 5,224,125, issued Jun. 29, 1993, to Hee Wong et al., discloses a signed phase-to-frequency (P-to-F) converter for use in a very high frequency PLL. Referring to FIG. 1, the quasi-digital, high frequency PLL 10 disclosed in the '125 patent includes a phase detector 12, a signed P-to-F converter 14, a 3-phase ring oscillator 16 and a frequency controlled oscillator (FCO) 18. FCO 18 and P-to-F converter 14 allow the use of a clock frequency which is no higher than the generating frequency of the PLL 10 to achieve acceptable phase resolution.

The P-to-F converter 14 converts the phase error information generated by the phase detector 12, which is in the form of UP, DOWN and HOLD signals, to multi-phase analog waveforms (PHASE 1, PHASE 2, PHASE 3) that can be used to drive the FCO 18. The output frequency of the P-to-F converter 14 determines the locking range of the PLL 10. The phase error direction, either plus or minus, is represented by the phase relationship, either leading or lagging, of the multi-phase outputs of the P-to-F converter 14, which the FCO 18 interprets as either an increase, a decrease or no change in the operating frequency.

As shown in FIG. 2, the P-to-F converter 14 disclosed in the '125 patent includes a counting circuit 21 that converts the plus/minus phase error signal UD_PI provided by the phase detector 12 into a 7-bit count signal. The three most significant bits (MSB) of the count signal, i.e., the HI_CNT signal, are used by a 3-phase waveform generator 25 to generate a 3-phase sawtooth pattern. The four least significant bits (LSB) of the count signal, i.e., the LO_CNT signal, are utilized by a pulse density modulation (PDM) circuit 28 to generate a signal that indicates the binary weight of the LSB part of the count. The output of the LSB PDM circuit 28 and the 3-phase sawtooth pattern are applied to three MSB PDM circuits 36, 38, 40. The three carry outputs of the MSB PDM circuits 36, 38, 40 are the digital outputs of the P-to-F converter 14. Following buffering, the three digital outputs of the P-to-F converter 14 are converted to analog signals (PHASE 1, PHASE 2, PHASE 3) by RC filters. The plus/minus phase is indicated by the leading/lagging phase relationship among the output waveforms.

While the P-to-F converter 14 disclosed in the '125 patent is a simple, yet elegant solution to a difficult problem, and has been commercially successful, there is always room for improvement. A problem associated with this solution is real time delay. That is, since generation of the triangular waveform is within the PLL tracking loop, the time required for synthesis directly impacts upon the response time of the phase error correction, which increases the phase jitter of the recovered clock.

U.S. Pat. No. 5,224,125 is hereby incorporated by reference in its entirety.

SUMMARY OF THE INVENTION

The present invention provides a triangular waveform synthesizer for a phase-to-frequency converter. The synthesizer generates a sawtooth and triangular wave using both Pulse Density Modulation (PDM) and a DC modulation scheme. To minimize both delay and logic, while continuing to provide reasonable resolution, a PDM and associated logic generates both the PDM output waveform with polarity information and two switching waveforms that encode the DC level information to provide a resultant sum. The resulting waveform, after filtering, is the triangular waveform. Since the switching and adding of the DC levels occurs in real time, the actual delay for the resultant triangular wave is only that of the PDM.

These and other features and advantages of the present invention will be better understood and appreciated upon consideration of the following detailed description and the accompanying drawings which set forth an illustrative embodiment in which the principles of the invention are utilized.

DETAILED DESCRIPTION OF THE INVENTION

Figure 3:
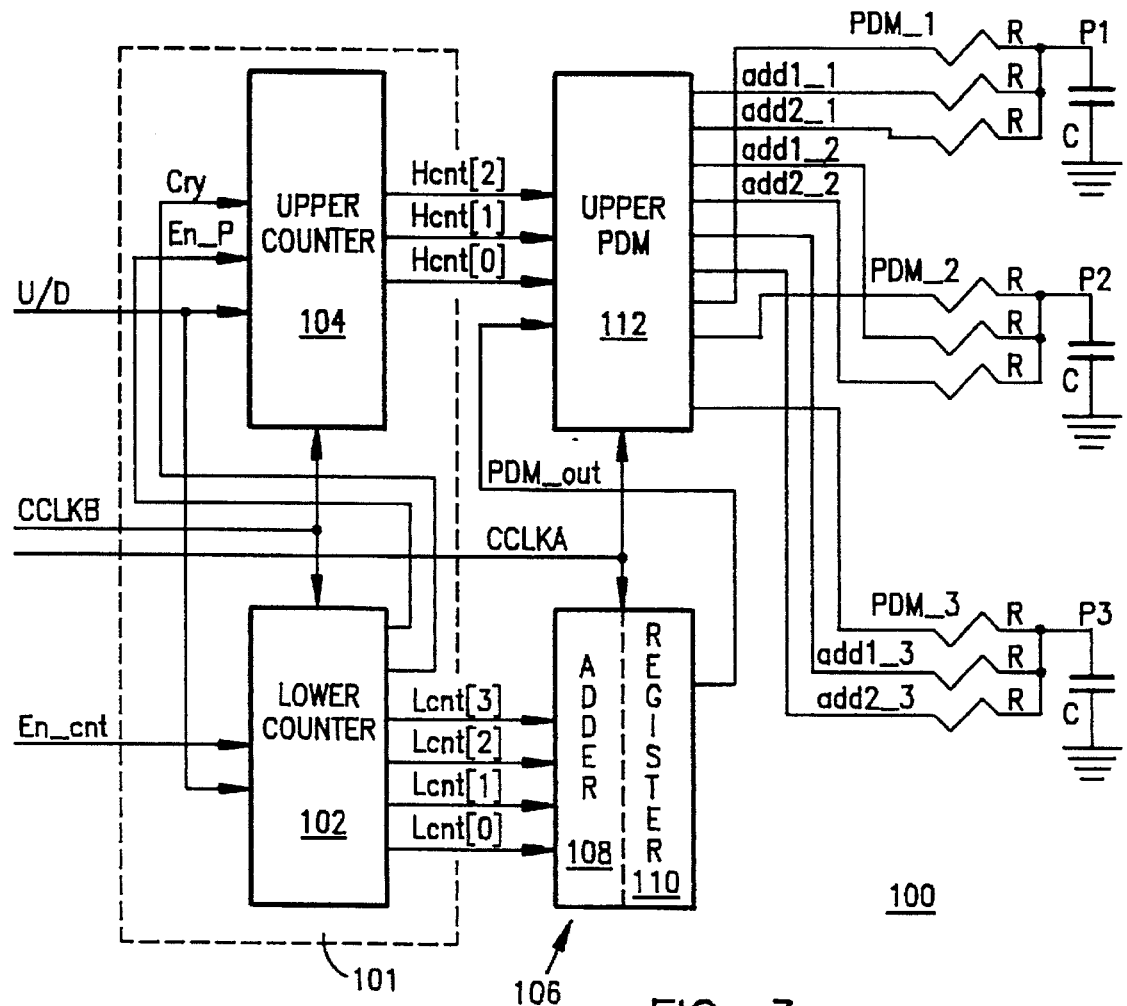
FIG. 3 is a block diagram illustrating a three phase triangular wave synthesizer in accordance with the present invention that may be utilized in the FIG. 1 PLL.

FIG. 3 shows a block diagram of a phase-to-frequency (P-to-F) converter circuit 100 that includes a 3-phase triangular wave synthesizer in accordance with the present invention. The P-to-F converter circuit 100 can be used to replace the P-to-F converter 14 in the FIG. 1 PLL circuit 10 described in the '125 Wong et al. patent.

Figure 1:
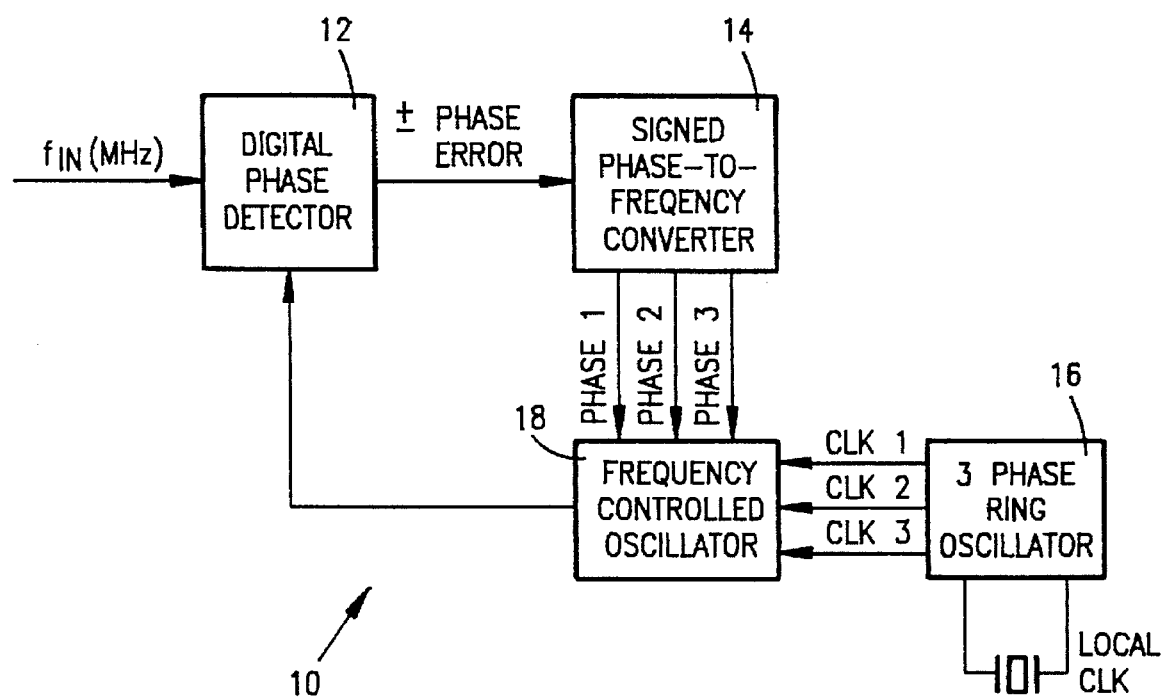
FIG. 1 is a block diagram illustrating a known digital phase locked loop.
Figure 2:
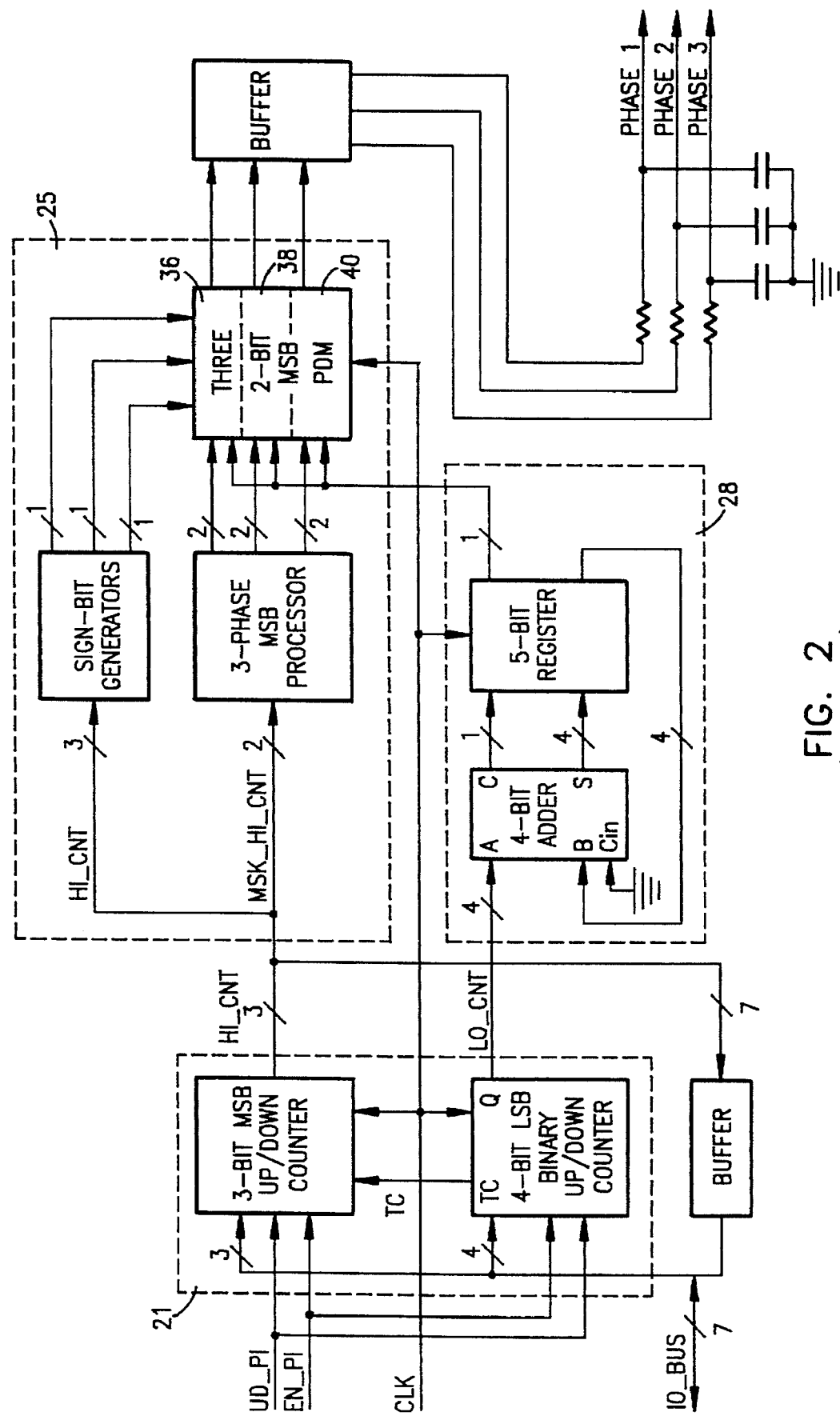
FIG. 2 is a block diagram illustrating a known phase-to-frequency converter that may be utilized in the FIG. 1 PLL.

P-to-F converter 100 receives two signals, an up/down signal U/D that represents the ± phase error quantities generated by the digital phase detector 12 and a count enable signal En_cnt. Input signal U/D controls the count direction of up/down counter 101 causing the counter 101 to count up when U/D=logic "1" and to count down when U/D=logic "0". The count enable signal En_cnt enables the counter 101 when in logic "1" and stops the counter 101 when in logic "0". Clock signals CCLKA and CCLKB are equivalent and are both derived from the output of the 3-phase ring oscillator 16 (FIG. 1).

Counter 101 may be a conventional up/down counter viewed as a lower 4-bit LSB binary up/down counter 102 and an upper 3-bit MSB binary up/down counter 104. The lower 4-bit counter 102 receives both the phase error signal U/D and the enable signal En_cnt. Thus, lower counter 102 stops if En_cnt=0. The carry output signal Cry of the 4-bit lower counter 102, together with a carry enable signal En_P, is fed into the upper 3-bit counter 104 that counts from 0 to 5. The lower counter 102 generates a four LSB output (Lcnt[0]–[3]) that is provided to a lower 4-bit PDM circuit 106 which operates in a manner similar to that described in the '125 patent. Lower PDM circuit 106 comprises a 4-bit adder 108 and a 5-bit register 110; the output of the 4-bit adder 108 is connected to the input of the 5-bit register 110. The lower PDM circuit 106 adds the previous contents of the register 110 to the current value of the LSB output (Lcnt[0]–[3]) of the lower counter 102. The operation is repetitious at every cycle of the CCLKA clock. The carry output signal PDM_out of the lower PDM circuit 106 becomes the saw tooth wave. Simply by inverting the PDM_out signal digitally causes a 180° phase shift. Hence, a triangular wave is formed by inverting the PDM_out signal every other full period of the clock signal.

Figure 4:
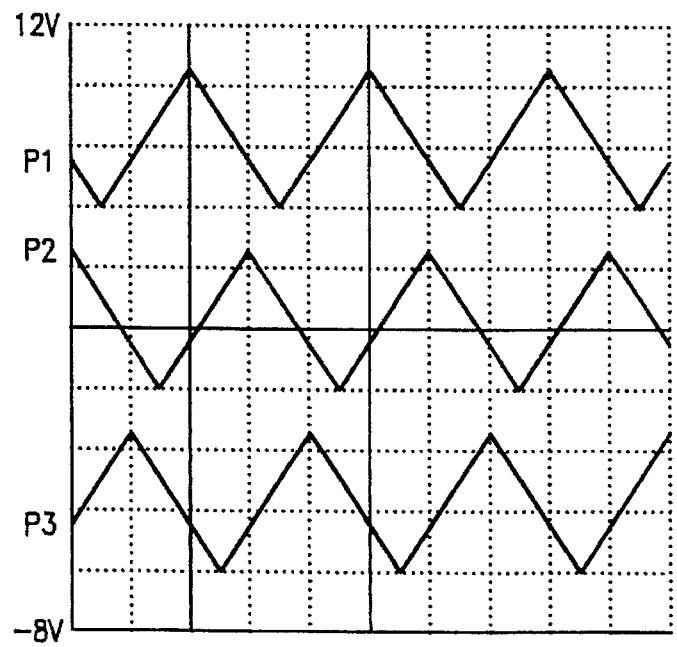
FIG. 4 is an oscilloscope waveform illustrating the three phases of the triangular wave generated by the FIG. 3 wave synthesizer.

The upper counter 104 generates a three MSB output (Hcnt[0]–[2]) based upon the phase error signal U/D. The three bits (Hcnt[0]–[2]) from the upper counter 104 and the carry output signal PDM_out of the lower PDM circuit 106 are provided to an upper PDM circuit 112 that generates three outputs per each phase P1, P2, P3: add1_n, add2_n and PDM_n (where n=1,2,3), as shown in FIG. 3. FIG. 4 is the scope waveform of the three phases of the triangular wave.

A description of the logic implementation of the upper PDM circuit 112 is provided below. For an actual implementation, reference is made to the gal equations provided in Appendix A at the end of this detailed description (Appendix A is an integral part of this patent specification).

The core of the upper PDM circuit 112 is a decoder that decodes the count from count 0 to count 5 of the upper counter 104. The logic equations of the three-per-phase outputs add1_n, add2_n and PDM_n of the upper PDM circuit 112 are as follows:

$$add1\_1 = ((count >= 1) \&\& (count <= 4)) \ ?(1):(0)$$

$$add2\_1 = ((count >= 2) \&\& (count <= 3)) \ ?(1):(0)$$

$$PDM\_1 = invt\char`\^PDM\_out$$

$$invt = ((count >= 3) \&\& (count <= 5)) \ ?(1):(0)$$

Figure 5:
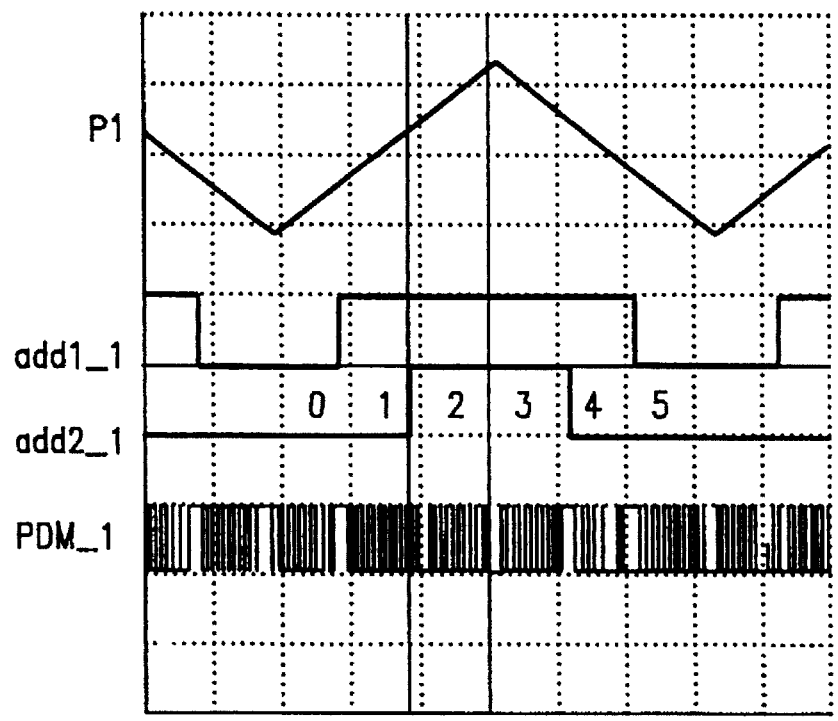
FIG. 5 illustrates the three output waveforms from the upper PDM block of the FIG. 3 circuit necessary to create phase 1 of the triangular waveform.
Figure 6:
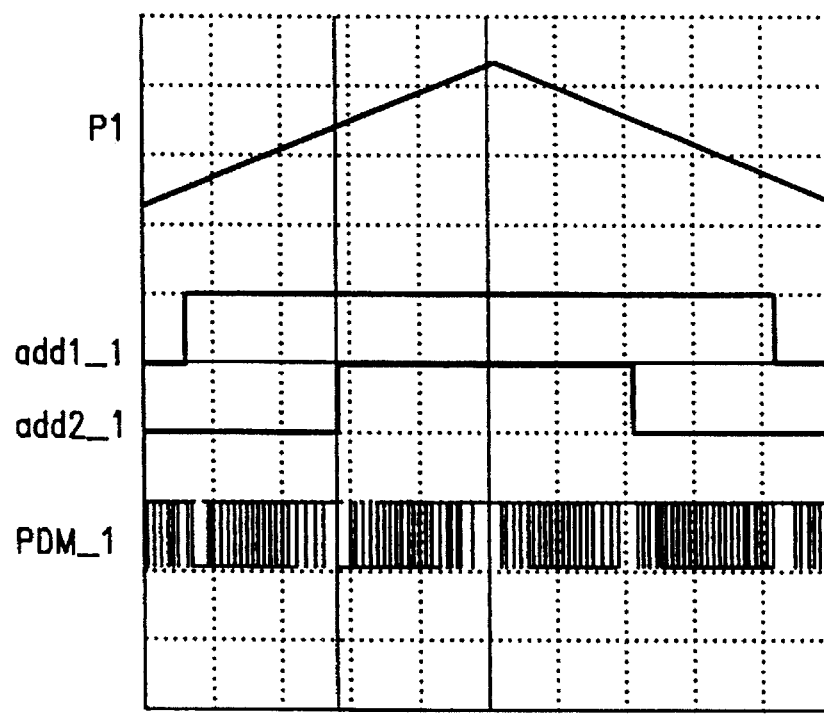
FIG. 6 is a magnification of the FIG. 5 waveforms illustrating the positive peak.
Figure 7:
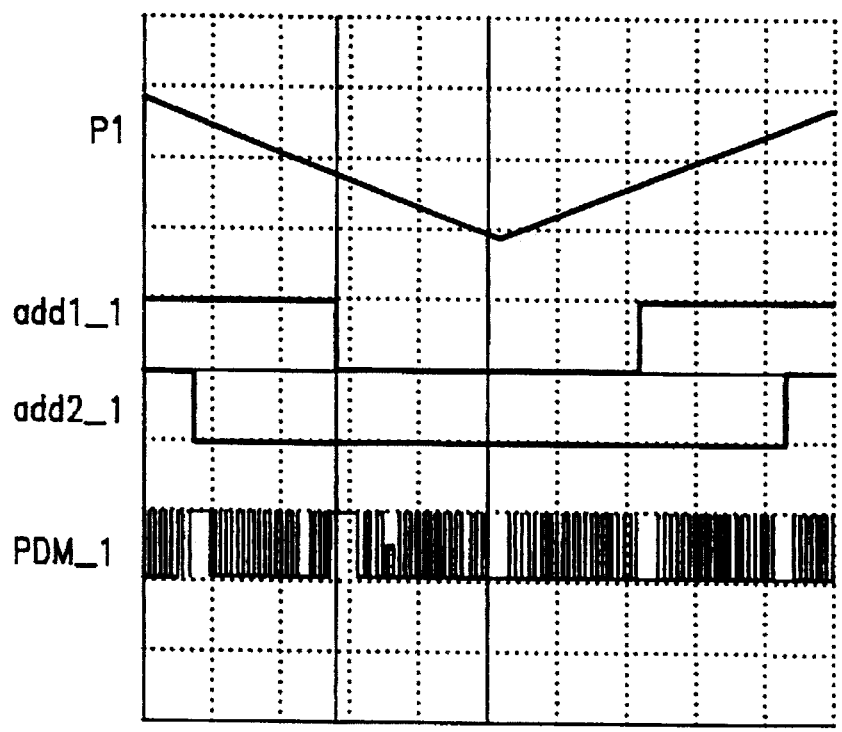
FIG. 7 is a magnification of the FIG. 5 waveforms illustrating the negative peak.
Figure 8:
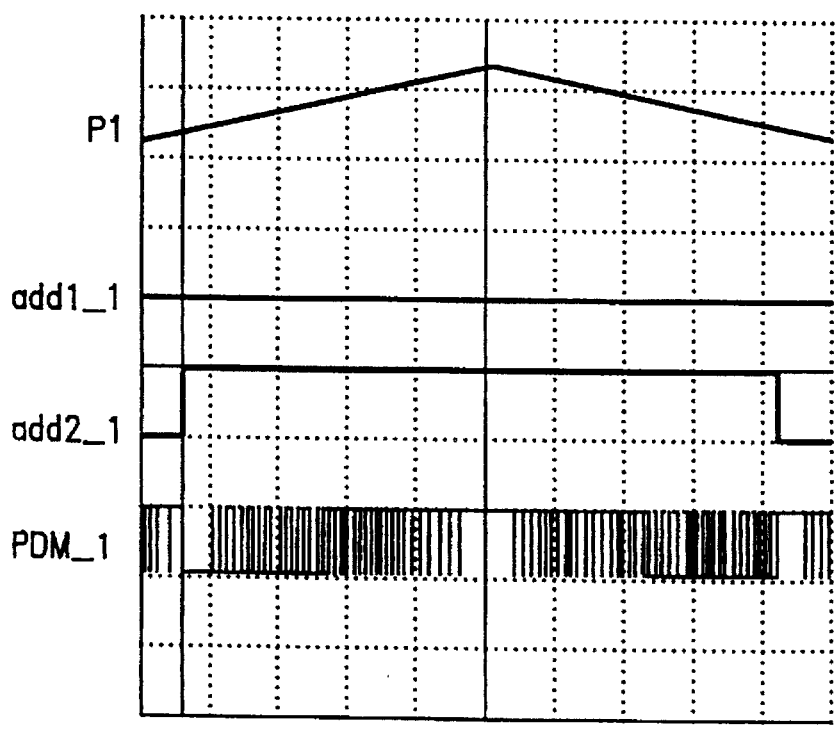
FIG. 8 is a further magnification of the FIG. 6 waveforms.
Figure 9:
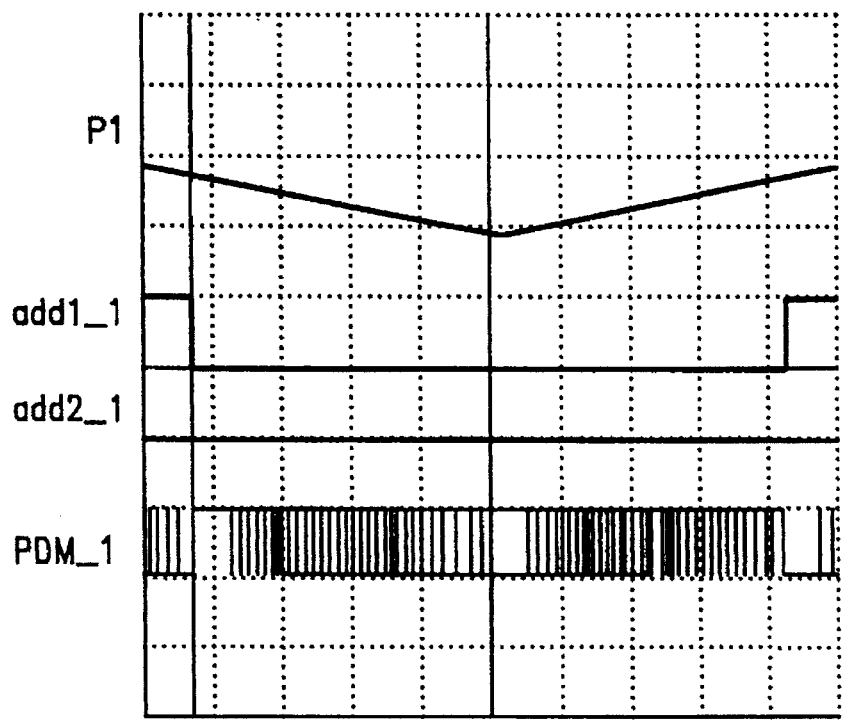
FIG. 9 is a further magnification of the FIG. 7 waveforms.
Figure 10:
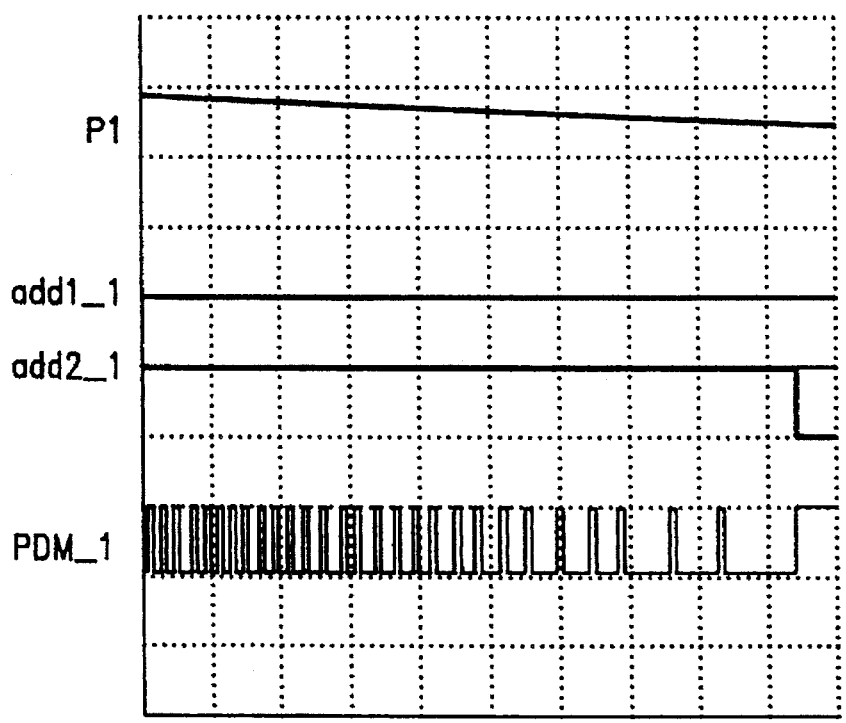
FIG. 10 illustrates the PDM.1 waveform.

FIG. 5 shows the three necessary outputs to create phase 1 (P1) of the triangular wave. The signal add1_1 is asserted during counts 1, 2, 3, and 4. The signal add2_1 is asserted during counts 2 and 3. PDM_1 is the PDM_out during count 0, 1, and 2; during count 3, 4, and 5, PDM_out is inverted. The resulting DC-modulated triangular waveform P1 is shown in FIG. 5.

More specifically, as shown in FIG. 5, during count 0, both the add1_1 and add2_1 switching outputs are de-asserted and the P1 phase output reflects the PDM_1 waveform. During count 1, switching output add1_1 is asserted, but switching output add2_1 remains de-asserted, resulting in the DC component of the waveform being added to PDM_1. During count 2, both the add1_1 and the add2_1 switching outputs are asserted and 2× the DC component is added to PDM_1. The reverse sequence for the switching outputs add1_1 and add2_1 occurs during counts 3, 4 and 5, but with PDM_1 inverted to provide the "downslope" of the FIG. 5 triangular waveform for phase P1.

To generate phase 2 (P2) of the triangular wave, the counter value must be offset by 2, which translates to a 120 degree phase shift. Similarly, offsetting the counter value by 4 provides a 240 degree phase shift for the phase 3 (P3) of the triangular wave.

FIGS. 6 through 10 are various magnifications of the FIG. 5 waves.

Resistors R in the FIG. 3 circuit 100 are all equally weighted.

It should be understood that various alternatives to the embodiments of the invention described herein may be employed in practicing the invention. It is intended that the following claims define the scope of the invention and that structures and methods within the scope of these claims and their equivalents be covered thereby.

APPENDIX A

```c
#include "romwcsc.h"

char *s[]={ "ev / ptf_hcnt",
          . "Pal=GAL22CV10-10L(Nat), Addbit=14, Datbit=10",
          . "rev 0 / Oct 12,1994  Wong Hee",
          . "rev 0 / Oct 12,1994" };

/* eqnfile pin assignment: i)nput, r)egistered op, c)ombinatorial op
    {"   1   2   3   4   5   6   7   8   9  10  11  12 "}
    {"  ck  i9  i8  i7  i6  i5  i4  i3  i2  i1  i0 gnd "}
    {"  13  14  15  16  17  18  19  20  21  22  23  24 "}
    {" /oe  c0  c1  c2  c3  r4  r5  r6  r7  r8  r9 vcc "}
*/
/* eqnfile additional equations:
    c3.trst = oe
    c2.trst = oe
    c1.trst = oe
    c0.trst = oe
*/

UL cf_hicnt,cf_tri_z_hiQs,SD_in,Gen_P,lo_carry,shift_dir,en_shift;
UL udown,load,reset,hicnt_dly,hicnt,tri_z_SD,tri_z_hiQs;

int  main(void);
void logic(void);
UL   bin_updwn_cntr(UL,UL,UL,UL,UL *);

UL  address,addrtop,rdata;
int addb,datb;

/* main ******************************************************** FUNCTION */
int main()
{ time(&TIMESTAMP);
. hkeep(s[0],s[1],s[2],s[3],&addrtop,&addb,&datb);
.
. for (address=0; address<=addrtop; address++)
.                   /* address bits  "5432109876543210" */
. { define_input_vector(address, "--111-----------", &cf_hicnt       );
. . define_input_vector(address, "-----111--------", &cf_tri_z_hiQs  );
. . define_input_vector(address, "--------1-------", &SD_in          );
. . define_input_vector(address, "---------1------", &Gen_P          );
. . define_input_vector(address, "----------1-----", &lo_carry       );
. . define_input_vector(address, "-----------1----", &shift_dir      );
. . define_input_vector(address, "------------1---", &en_shift       );
. . define_input_vector(address, "-------------1--", &udown          );
. . define_input_vector(address, "--------------1-", &load           );
. . define_input_vector(address, "---------------1", &reset          );
. . logic(); rdata=(UL)0;
. .
. .                 /* data bits   "5432109876543210" */
. . define_output_vector(&rdata, "------111-------", hicnt_dly       );
. . define_output_vector(&rdata, "---------111----", hicnt           );
. . define_output_vector(&rdata, "------------0---", tri_z_SD        );
. . define_output_vector(&rdata, "-------------111", tri_z_hiQs      );
. . store_rdata(address,rdata);
. }
``` ptf_hcnt.c

```
. write_rdata_old  up(); return(0);
}              cleanup()

/* logic ************************************************** FUNCTION */
void logic()
{
. tri_z_SD = SD_in;
.
. /* change invalid states to valid states */
. if (cf_hicnt>=6) { cf_hicnt &= 3; }
.
. /* one clock delay for hicnt_dly */
. hicnt_dly = cf_hicnt;
.
. /* for test purpose, shift hicnt_dly by +/- 120 degrees */
. if (en_shift)
. { if (shift_dir) {
. . . if (hicnt_dly >= 4) {
. . . . hicnt_dly -= 4;   /* wrap arround */
. . . } else {
. . . . hicnt_dly += 2;   /* 2/6 == 120/360 degs */
. . . }
. . .
. . } else {
. . . if (hicnt_dly <  2) {
. . . . hicnt_dly += 4;   /* wrap arround */
. . . } else {
. . . . hicnt_dly -= 2;   /* 2/6 == 120/360 degs */
. . . }
. . }
. }
.
. /* upcount or downcount, counting seq 0,1,2,3,4,5 */
. hicnt = cf_hicnt;
. bin_updwn_cntr(6,udown,Gen_P,lo_carry,&hicnt);
.
. tri_z_hiQs = cf_hicnt;
.
. /* clear or load counter */
. if (reset) {
. . hicnt_dly = 0;
. . hicnt = 0;
. .
. } else if (load) {
. . hicnt = cf_tri_z_hiQs;
. }
. return;
}

/* bin_updwn_cntr ***************************************** FUNCTION */
UL bin_updwn_cntr(maxcntpl,up_down,en__P,en__T,  cQs)
 UL maxcntpl,up_down,en__P,en__T, &cQs;
{ UL cnt_max,count,carry,over,under;
.
. cnt_max = maxcntpl - 1;
``` ptf_hcnt.c

```
  count = *cQs;

over  = (((count >= cnt_max)&&(up_down==1)) ? (1) : (0));
  under = (((count == 0)       &&(up_down==0)) ? (1) : (0));
  if (!en__T) {
  . carry=0;       /* en__T cuts off carry */
  } else {
  . carry = (over | under);
  } if ((en__T)&&(en__P))
  { if (up_down) { /* 1=up */
  . . *cQs = ((over)  ?         (0) : (count+1));
  . } else {       /* 0=down */
  . . *cQs = ((under) ? (cnt_max) : (count-1));
  . }
  }
  return(carry);
}
```

3e        ptf_hcnt.c

```
                    e:\
PAL map :  f0evx\  ,crm\crm2\pal\ptf_hcnt.paa
           Fri/Oct 21,1994/17:42:59   [000.00.02-t7_m29-D470]
SRC file : f0evx\e:\crm\crm2\pal\ptf_hcnt.rom
           pal=gal22cv10-10l(nat), addbit=14, datbit=10
           rev 0 / Oct 12,1994  Wong Hee
           rev 0 / Oct 12,1994
           Fri/Oct 21,1994/17:42:52
                              imsk: 11 1111 1111
     pt# (A)32 1098 7654 3210 (D)98 7654 3210
     <1>    oo ---- ---o 1--o     1- ---- ----
     <2>    -1 ---- ---1 1--o     1- ---- ----
     <3>    1o ---- ---- o--o     1- ---- ----
     <1>    o- ---- ---- o---  X  o- ---- ----
     <2>    -o ---- ---1 1---  X  o- ---- ----
     <3>    -- ---- ---- ---1  X  o- ---- ----
     <4>    -1 ---- ---o ----  X  o- ---- ----
     <5>    -1 ---- ---- o---  X  o- ---- ----
     <6>    1o ---- ---- 1---  X  o- ---- ----

<1>    oo ---- ---1 1--o    -1 ---- ----
     <2>    -1 ---- ---- o--o    -1 ---- ----
     <3>    1o ---- ---o 1--o    -1 ---- ----
     <1>    o- ---- ---o 1---  X  -o ---- ----
     <2>    -o ---- ---- o---  X  -o ---- ----
     <3>    -- ---- ---- ---1  X  -o ---- ----
     <4>    -1 ---- ---- 1---  X  -o ---- ----
     <5>    1- ---- ---1 1---  X  -o ---- ----

<1>    -- 1--- ---- ---o    -- 1--- ----
     <1>    -- o--- ---- ----  X  -- o--- ----
     <2>    -- ---- ---- ---1  X  -- o--- ----

<1>    oo o--- -11- -ooo    -- -1-- ----
     <2>    -- -1-- ---- --1o    -- -1-- ----
     <3>    -1 1--- -11- -1oo    -- -1-- ----
     <4>    1o o--- ---- -1oo    -- -1-- ----
     <5>    1o ---- -o-- --oo    -- -1-- ----
     <6>    1o ---- ---o- --oo    -- -1-- ----
     <7>    1o 1--- ---- -ooo    -- -1-- ----
     <1>    oo ---- ---- -1o-  X  -- -o-- ----
     <2>    oo 1--- ---- --o-  X  -- -o-- ----
     <3>    o- ---- -o-- --o-  X  -- -o-- ----
     <4>    o- ---- --o-- --o-  X  -- -o-- ----
     <5>    -o 1--- -11- -1o-  X  -- -o-- ----
     <6>    -- -o-- ---- --1-  X  -- -o-- ----
     <7>    -- ---- ---- ---1  X  -- -o-- ----
     <8>    -1 o--- ---- --o-  X  -- -o-- ----
     <9>    -1 ---- -o-- --o-  X  -- -o-- ----
    <10>    -1 ---- --o- --o-  X  -- -o-- ----
    <11>    -1 ---- ---- -oo-  X  -- -o-- ----
    <12>    1- o--- -11- -oo-  X  -- -o-- ----

<1>    oo 1--- -11- -1oo    -- --1- ----
     <2>    -- --1- ---- --1o    -- --1- ----
     <3>    -1 o--- ---- -1oo    -- --1- ----
     <4>    -1 ---- -o-- --oo    -- --1- ----
     <5>    -1 ---- --o- --oo    -- --1- ----
``` ptf_hcnt.paa

```
<6>  -1 1***  -*t  -ooo     -- --1- ----
<7>  1o o---  -11- -ooo     -- --1- ----
<1>  oo o---  ---- --o-  X  -- --o- ----
<2>  -o ----  -o-- --o-  X  -- --o- ----
<3>  -o ----  --o- --o-  X  -- --o- ----
<4>  -o 1---  ---- -oo-  X  -- --o- ----
<5>  -- --o-  ---- --1-  X  -- --o- ----
<6>  -- ----  ---- ---1  X  -- --o- ----
<7>  -1 o---  -11- -oo-  X  -- --o- ----
<8>  -1 1---  -11- -1o-  X  -- --o- ----
<9>  1o ----  ---- -1o-  X  -- --o- ----

<1>  -- o---  -11- --oo     -- ---1 ----
<2>  -- ---1  ---- --1o     -- ---1 ----
<3>  -- 1---  -o-- --oo     -- ---1 ----
<4>  -- 1---  --o- --oo     -- ---1 ----
<1>  -- o---  -o-- --o-  X  -- ---o ----
<2>  -- o---  --o- --o-  X  -- ---o ----
<3>  -- ---o  ---- --1-  X  -- ---o ----
<4>  -- ----  ---- ---1  X  -- ---o ----
<5>  -- 1---  -11- --o-  X  -- ---o ----

<1>  -- ----  o--- ----     -- ---- 1---
<1>  -- ----  1--- ----     -- ---- o---

<1>  1o ----  ---- ----     -- ---- -1--
<1>  o- ----  ---- ----  X  -- ---- -o--
<2>  -1 ----  ---- ----  X  -- ---- -o--

<1>  -1 ----  ---- ----     -- ---- --1-
<1>  -o ----  ---- ----     -- ---- --o-

<1>  -- 1---  ---- ----     -- ---- ---1
<1>  -- o---  ---- ----     -- ---- ---o  (#pt=73,csum=D470)
```

```
                      \e:\
EQN file : f0evx  \crm\crm2\pal\ptf_hcnt.eqn
           Fri/Oct 21,1994/17:43:04  [eqn2jed ptf_hnt.eqn]
SRC file : f0evx\e:\crm\crm2\pal\ptf_hcnt.paa  ptf_hcnt
           Fri/Oct 21,1994/17:42:59  [000.00.02-t73m29-D470]

chip ptf_hcnt gal22cv10-101(nat)
; ptf_hcnt.c xref: i)nput, r)egistered output, c)ombinatorial output
; -----------------------------------------------------------------
;    111-----------    cf_hicnt        r6..r4    20,19,18
;    ---111--------    cf_tri_z_hiQs   c2..c0    16,15,14
;    ------1-------    SD_in           i7        4
;    -------1------    Gen_P           i6        5
;    --------1-----    lo_carry        i5        6
;    ---------1----    shift_dir       i4        7
;    ----------1---    en_shift        i3        8
;    -----------1--    udown           i2        9
;    ------------1-    load            i1        10
;    -------------1    reset           i0        11
;---32109876543210-------------------------------------------
;    111--------       hicnt_dly       r9..r7    23,22,21
;    ---111----        hicnt           r6..r4    20,19,18
;    ------o---        tri_z_SD        c3        17
;    -------111        tri_z_hiQs      c2..c0    16,15,14
;------------------------------------------------------------
; pin  1    2    3    4    5    6    7    8    9    10   11   12
      ck   i9   i8   i7   i6   i5   i4   i3   i2   i1   i0   gnd ; pin  13   14   15   16   17   18   19   20   21   22   23   24
      /oe  c0   c1   c2   c3   r4   r5   r6   r7   r8   r9   vcc
;------------------------------------------------------------
equations r9  :=  /r6  *  /r5  *  /i4  *   i3  *  /i0
     +   r5  *   i4  *   i3  *  /i0
     +   r6  *  /r5  *  /i3  *  /i0 r8  :=  /r6  *  /r5  *   i4  *   i3  *  /i0
     +   r5  *  /i3  *  /i0
     +   r6  *  /r5  *  /i4  *   i3  *  /i0 r7  :=   r4  *  /i0 r6  :=  /r6  *  /r5  *  /r4  *   i6  *   i5  *  /i2  *  /i1  *  /i0
     +   c2  *   i1  *  /i0
     +   r5  *   r4  *   i6  *   i5  *   i2  *  /i1  *  /i0
     +   r6  *  /r5  *  /r4  *   i2  *  /i1  *  /i0
     +   r6  *  /r5  *  /i6  *   i1  *  /i0
     +   r6  *  /r5  *  /i5  *   i1  *  /i0
     +   r6  *  /r5  *   r4  *  /i2  *  /i1  *  /i0 r5  :=  /r6  *  /r5  *   r4  *   i6  *   i5  *   i2  *  /i1  *  /i0
     +   c1  *   i1  *  /i0
     +   r5  *  /r4  *   i2  *  /i1  *  /i0
     +   r5  *  /i6  *   i1  *  /i0
     +   r5  *  /i5  *   i1  *  /i0
     +   r5  *   r4  *  /i2  *  /i1  *  /i0
     +   r6  *  /r5  *  /r4  *   i6  *   i5  *  /i2  *  /i1  *  /i0
```

```
r4  :=  /r4  *  i6  *  i5  * /i1  * /i0
    +    c0  *  i1  * /i0
    +    r4  * /i6  * /i1  * /i0
    +    r4  * /i5  * /i1  * /i0 c3  =  /i7 c2  =  r6  * /r5 c1  =  r5 c0  =  r4 c3.trst = oe
c2.trst = oe
c1.trst = oe
c0.trst = oe

;eqnfile checksum : 1107
```

2e ptf_hcnt.eqn

```c
#include "romwcse.h"
             YOMWcse.h
char *s[]={ "ev / ptf_lcnt",
          . "Pal=GAL22CV10-10L(Nat), Addbit=13, Datbit=10",
          . "rev 0 / Oct 12,1994  Wong Hee",
          . "rev 0 / Oct 12,1994" };

/* eqnfile pin assignment: i)nput, r)egistered op, c)ombinatorial op
    {"   1    2    3    4    5    6    7    8    9   10   11   12  "}
    {"  ck   i9   i8   i7   i6   i5   i4   i3   i2   i1   i0  gnd  "}
    {"  13   14   15   16   17   18   19   20   21   22   23   24  "}
    {" /oe   c0   c1   c2   c3   r4   r5   r6   r7   c8   c9  vcc  "}
*/
/* eqnfile additional equations:
    c3.trst = oe
    c2.trst = oe
    c1.trst = oe
    c0.trst = oe
*/

UL cf_Gen_P,cf_locnt_h,cf_locnt_l,cf_tri_z_lhQs,cf_tri_z_llQs;
UL encnt,udown,load,reset;
UL Gen_P,lo_carry,locnt_h,locnt_l,tri_z_lhQs,tri_z_llQs;

int  main(void);
void logic(void);
UL   bin_updwn_cntr(UL,UL,UL,UL,UL *);

UL address,addrtop,rdata;
int addb,datb;

/* main ********************************************************* FUNCTION */
int main()
{ time(&TIMESTAMP);
. hkeep(s[0],s[1],s[2],s[3],&addrtop,&addb,&datb);
.
. for (address=0; address<=addrtop; address++)
.              /* address bits  "5432109876543210"  */
. { define_input_vector(address, "---1------------", &cf_Gen_P        );
. . define_input_vector(address, "----11----------", &cf_locnt_h      );
. . define_input_vector(address, "------11--------", &cf_locnt_l      );
. . define_input_vector(address, "--------11------", &cf_tri_z_lhQs   );
. . define_input_vector(address, "----------11----", &cf_tri_z_llQs   );
. . define_input_vector(address, "------------1---", &encnt           );
. . define_input_vector(address, "-------------1--", &udown           );
. . define_input_vector(address, "--------------1-", &load            );
. . define_input_vector(address, "---------------1", &reset           );
. . logic(); rdata=(UL)0;
.
.              /*   data bits   "5432109876543210"  */
. . define_output_vector(&rdata, "-------1--------", Gen_P            );
. . define_output_vector(&rdata, "--------1-------", lo_carry         );
. . define_output_vector(&rdata, "--------11------", locnt_h          );
. . define_output_vector(&rdata, "----------11----", locnt_l          );
. . define_output_vector(&rdata, "------------11--", tri_z_lhQs       );
. . define_output_vector(&rdata, "--------------11", tri_z_llQs       );
```

```
. . store_rdata(add    ss,rdata);              ADDRESS
. }
. write_rdata_cleanup(); return(0);
}

/* logic ************************************************ FUNCTION */
void logic()
{
. locnt_l  = cf_locnt_l;
. locnt_h  = cf_locnt_h;
. Gen_P    = bin_updwn_cntr(4,udown,        1,encnt,&locnt_l);
. lo_carry = bin_updwn_cntr(4,udown,cf_Gen_P, 1,&locnt_h);

. tri_z_llQs = cf_locnt_l;
. tri_z_lhQs = cf_locnt_h;

. /* clear or load counter */
. if (reset) {
. . lo_carry = Gen_P = 0;
. . locnt_l = 0;
. . locnt_h = 0;
.
. } else if (load) {
. . locnt_l = cf_tri_z_llQs;
. . locnt_h = cf_tri_z_lhQs;
. }
. return;
}

/* bin_updwn_cntr **************************************** FUNCTION */
UL bin_updwn_cntr(maxcntp1,up_down,en__P,en__T,  cQs)
UL maxcntp1,up_down,en__P,en__T, *cQs;
{ UL cnt_max,count,carry,over,under;

. cnt_max = maxcntp1 - 1;
. count = *cQs;

. over  = (((count >= cnt_max)&&(up_down==1)) ? (1) : (0));
. under = (((count == 0)      &&(up_down==0)) ? (1) : (0));
. if (!en__T) {
. . carry=0;    /* en__T cuts off carry */
. } else {
. . carry = (over | under);
. }

. if ((en__T)&&(en__P))
. { if (up_down) {  /* 1=up */
. . . *cQs = ((over)  ?       (0) : (count+1));
. . } else {        /* 0=down */
. . . *cQs = ((under) ? (cnt_max) : (count-1));
. . }
. }
. return(carry);
}
```

2e                                                           ptf_lcnt.c

```
PAL map : f0evx\e:\crm\crm2\pal\ptf_lcnt.paa
          Thu/Oct 13,1994/11:45:29  [000.00.01-t61m26-AD9F]
SRC file : f0evx\e:\crm\crm2\pal\ptf_lcnt.rom
          pal=gal22cv10-101(nat), addbit=13, datbit=10
          rev 0 / Oct 12,1994   Wong Hee
          rev 0 / Oct 12,1994
          Thu/Oct 13,1994/11:45:23
                              imsk: 11 1111 1111
     pt# (A)2 1098 7654 3210 (D)98 7654 3210
     <1>  - --oo ---- 1o-o    1- ---- ----
     <2>  - --11 ---- 11-o    1- ---- ----
     <1>  - --o- ---- -1--    X o- ---- ----
     <2>  - ---- ---- o---    X o- ---- ----
     <3>  - ---- ---- ---1    X o- ---- ----
     <4>  - ---1 ---- -o--    X o- ---- ----
     <5>  - --1o ---- ----    X o- ---- ----

<1>  - oo-- ---- -o-o    -1 ---- ----
     <2>  - 11-- ---- -1-o    -1 ---- ----
     <1>  - o--- ---- -1--    X -o ---- ----
     <2>  - ---- ---- ---1    X -o ---- ----
     <3>  - -1-- ---- -o--    X -o ---- ----
     <4>  - 1o-- ---- ----    X -o ---- ----

<1>  o 1--- ---- --oo    -- 1--- ----
     <2>  - ---- 1--- --1o    -- 1--- ----
     <3>  - 1o-- ---- -1oo    -- 1--- ----
     <4>  - 11-- ---- -ooo    -- 1--- ----
     <5>  1 oo-- ---- -ooo    -- 1--- ----
     <6>  1 o1-- ---- -1oo    -- 1--- ----
     <1>  o o--- ---- --o-    X -- o--- ----
     <2>  - oo-- ---- -1o-    X -- o--- ----
     <3>  - o1-- ---- -oo-    X -- o--- ----
     <4>  - ---- o--- --1-    X -- o--- ----
     <5>  - ---- ---- ---1    X -- o--- ----
     <6>  1 1o-- ---- -oo-    X -- o--- ----
     <7>  1 11-- ---- -1o-    X -- o--- ----

<1>  o -1-- ---- --oo    -- -1-- ----
     <2>  - ---- -1-- --1o    -- -1-- ----
     <3>  1 -o-- ---- --oo    -- -1-- ----
     <1>  o -o-- ---- --o-    X -- -o-- ----
     <2>  - ---- -o-- --1-    X -- -o-- ----
     <3>  - ---- ---- ---1    X -- -o-- ----
     <4>  1 -1-- ---- --o-    X -- -o-- ----

<1>  - --oo ---- 1ooo    -- --1- ----
     <2>  - --o1 ---- 11oo    -- --1- ----
     <3>  - ---- --1- --1o    -- --1- ----
     <4>  - --1o ---- -1oo    -- --1- ----
     <5>  - --1- ---- o-oo    -- --1- ----
     <6>  - --11 ---- -ooo    -- --1- ----
     <1>  - --oo ---- -1o-    X -- --o- ----
     <2>  - --o- ---- o-o-    X -- --o- ----
     <3>  - --o1 ---- -oo-    X -- --o- ----
     <4>  - ---- --o- --1-    X -- --o- ----
     <5>  - ---- ---- ---1    X -- --o- ----
``` ptf_lcnt.paa

```
<6>    -  --1o  -**-  1oo-   X  --  --o-  ----
<7>    -  --11  ----  11o-   X  --  --o-  ----

<1>    -  ---o  ----  1-oo      --  ---1  ----
<2>    -  ----  ---1  --1o      --  ---1  ----
<3>    -  ---1  ----  o-oo      --  ---1  ----
<1>    -  ---o  ----  o-o-   X  --  ---o  ----
<2>    -  ----  ---o  --1-   X  --  ---o  ----
<3>    -  ----  ----  ---1   X  --  ---o  ----
<4>    -  ---1  ----  1-o-   X  --  ---o  ----

<1>    -  1---  ----  ----      --  ----  1---
<1>    -  o---  ----  ----      --  ----  o---

<1>    -  -1--  ----  ----      --  ----  -1--
<1>    -  -o--  ----  ----      --  ----  -o--

<1>    -  --1-  ----  ----      --  ----  --1-
<1>    -  --o-  ----  ----      --  ----  --o-

<1>    -  ---1  ----  ----      --  ----  ---1
<1>    -  ---o  ----  ----      --  ----  ---o   (#pt=61,csum=AD9F)
```

```
EQN file : f0evx\e:\crm\crm2\pal\ptf_lcnt.eqn
           Thu/Oct 13,1994/11:45:34  [eqn2jed ptf_lcnt.eqn]
SRC file : f0evx\e:\crm\crm2\pal\ptf_lcnt.paa
           Thu/Oct 13,1994/11:45:29  [000.00.01-t61m26-AD9F]

chip ptf_lcnt gal22cv10-10l(nat)
; ptf_lcnt.c xref: i)nput, r)egistered output, c)ombinatorial output
; ---------------------------------------------------------------
;     1------------    cf_Gen_P       c9       23
;     -11----------    cf_locnt_h     r7..r6   21,20
;     ---11--------    cf_locnt_l     r5..r4   19,18
;     -----11------    cf_tri_z_lhQs  c3..c2   17,16
;     -------11----    cf_tri_z_llQs  c1..c0   15,14
;     ---------1---    encnt          i3       8
;     ----------1--    udown          i2       9
;     -----------1-    load           i1       10
;     ------------1    reset          i0       11
;---2109876543210---------------------------------------
;     1----------     Gen_P          c9       23
;     -1---------     lo_carry       c8       22
;     --11-------     locnt_h        r7..r6   21,20
;     ----11-----     locnt_l        r5..r4   19,18
;     ------11---     tri_z_lhQs     c3..c2   17,16
;     --------11-     tri_z_llQs     c1..c0   15,14
;--------------------------------------------------------
; pin    1    2    3    4    5    6    7    8    9    10   11   12
         ck   i9   i8   i7   i6   i5   i4   i3   i2   i1   i0   gnd ; pin    13   14   15   16   17   18   19   20   21   22   23   24
         /oe  c0   c1   c2   c3   r4   r5   r6   r7   c8   c9   vcc
;--------------------------------------------------------
equations c9  =  /r5  *  /r4  *   i3  *  /i2  *  /i0
     +   r5  *   r4  *   i3  *   i2  *  /i0 c8  =  /r7  *  /r6  *  /i2  *  /i0
     +   r7  *   r6  *   i2  *  /i0 r7  := /c9  *   r7  *  /i1  *  /i0
     +   c3  *   i1  *  /i0
     +   r7  *  /r6  *   i2  *  /i1  *  /i0
     +   r7  *   r6  *  /i2  *  /i1  *  /i0
     +   c9  *  /r7  *  /r6  *  /i2  *  /i1  *  /i0
     +   c9  *  /r7  *   r6  *   i2  *  /i1  *  /i0 r6  := /c9  *   r6  *  /i1  *  /i0
     +   c2  *   i1  *  /i0
     +   c9  *  /r6  *  /i1  *  /i0 r5  := /r5  *  /r4  *   i3  *  /i2  *  /i1  *  /i0
     +  /r5  *   r4  *   i3  *   i2  *  /i1  *  /i0
     +   c1  *   i1  *  /i0
     +   r5  *  /r4  *   i2  *  /i1  *  /i0
     +   r5  *  /i3  *  /i1  *  /i0
     +   r5  *   r4  *  /i2  *  /i1  *  /i0
```

```
r4  :=  /r4  *  i3  *  /i1  *  /i0
     +   c0  *  i1  *  /i0
     +   r4  *  /i3  *  /i1  *  /i0 c3   =   r7 c2   =   r6 c1   =   r5 c0   =   r4 c3.trst = oe
c2.trst = oe
c1.trst = oe
c0.trst = oe

;eqnfile checksum : F7E1
```

```c
#include "romwcsc.h"
char *s[]={ "ev / ptf_lpdm",
          . "Pal=GAL22CV10-10L(Nat), Addbit=10, Datbit=6",
          . "rev 0 / Oct 12,1994  Wong Hee",
          . "rev 0 / Oct 12,1994" };

/* eqnfile pin assignment: i)nput, r)egistered op, c)ombinatorial op
   {"  1   2   3   4   5   6   7   8   9  10  11  12 "}
   {"  ck  i9  i8  i7  i6  i5  i4  i3  i2  i1  i0  gnd "}
   {"  13  14  15  16  17  18  19  20  21  22  23  24 "}
   {"  i10 r0  r1  r2  r3  c4  r5  r6  r7  r8  r9  vcc "}
*/

UL cf_carry_1,cf_PDMaccum_h,cf_PDMaccum_l,locnt_h,locnt_l,reset;
UL PDM_out,carry_1,PDMaccum_h,PDMaccum_l;

int  main(void);
void logic(void);
UL   bin_adder(UL,UL,UL,UL,UL *);

UL   address,addrtop,rdata;
int  addb,datb;

/* main ******************************************************* FUNCTION */
int main()
{ time(&TIMESTAMP);
. hkeep(s[0],s[1],s[2],s[3],&addrtop,&addb,&datb);
.
. for (address=0; address<=addrtop; address++)
              /* address bits  "5432109876543210"  */
. { define_input_vector(address, "-------1---------", &cf_carry_1        );
. . define_input_vector(address, "--------11--------", &cf_PDMaccum_h    );
. . define_input_vector(address, "----------11------", &cf_PDMaccum_l    );
. . define_input_vector(address, "------------11----", &locnt_h          );
. . define_input_vector(address, "--------------11--", &locnt_l          );
. . define_input_vector(address, "----------------1-", &reset            );
. . logic(); rdata=(UL)0;
.
. .         /*   data bits   "5432109876543210"  */
. . define_output_vector(&rdata, "-----------1------", PDM_out            );
. . define_output_vector(&rdata, "------------1-----", carry_1            );
. . define_output_vector(&rdata, "-------------11---", PDMaccum_h         );
. . define_output_vector(&rdata, "---------------11-", PDMaccum_l         );
. . store_rdata(address,rdata);
. }
. write_rdata_cleanup(); return(0);
}

/* logic ****************************************************** FUNCTION */
void logic()
{
. carry_1 = bin_adder(4,         0, locnt_l,cf_PDMaccum_l,&PDMaccum_l);
. PDM_out = bin_adder(4,cf_carry_1, locnt_h,cf_PDMaccum_h,&PDMaccum_h);
.
``` ptf_lpdm.c

```
.  if (reset)
.  { PDM_out=carry_l=PDMaccum_h=PDMaccum_l=0;
.  }
.  return;
}

/* bin_adder **************************************************** FUNCTION */
UL bin_adder(maxcntp1,carry_in,add1,add2,sum)
UL maxcntp1,carry_in,add1,add2,*sum;
{ UL carry,summ;
.  summ = add1 + add2 + carry_in;
.  if (summ >= maxcntp1) {
.  .  summ -= maxcntp1;
.  .  carry = 1;
.  } else {
.  .  carry = 0;
.  }
.  *sum = summ;
.  return(carry);
}
```

```
                    e:\
PAL map :   f0evx\.  .crm\crm2\pal\ptf_lpdm.paa
            Thu/Oct 13,1994/14:23:37  [000.00.00-t76m34-BBEA]
SRC file :  f0evx\e:\crm\crm2\pal\ptf_lpdm.rom
            pal=gal22cv10-101(nat), addbit=10, datbit=6
            rev 0 / Oct 12,1994  Wong Hee
            rev 0 / Oct 12,1994
            Thu/Oct 13,1994/14:23:32
                    imsk:  11 1111
       pt# (A)98 7654 3210 (D)54 3210
       <1>    -- 1--1 1--o     1- ----
       <2>    -1 ---1 ---o     1- ----
       <3>    -1 1--- 1--o     1- ----
       <4>    1- ---1 1--o     1- ----
       <5>    1- 1--1 ---o     1- ----
       <6>    11 ---- 1--o     1- ----
       <7>    11 1--- ---o     1- ----
       <1>    oo o--- ----   X o- ----
       <2>    oo ---- o---   X o- ----
       <3>    o- o--o ----   X o- ----
       <4>    o- ---o o---   X o- ----
       <5>    -o o--- o---   X o- ----
       <6>    -o ---o ----   X o- ----
       <7>    -- o--o o---   X o- ----
       <8>    -- ---- ---1   X o- ----

<1>    -- --1- -11o     -1 ----
       <2>    -- -1-- -1-o     -1 ----
       <3>    -- -11- --1o     -1 ----
       <1>    -- -oo- ----   X -o ----
       <2>    -- -o-- -o--   X -o ----
       <3>    -- -o-- --o-   X -o ----
       <4>    -- --o- -o--   X -o ----
       <5>    -- ---- -oo-   X -o ----
       <6>    -- ---- ---1   X -o ----

<1>    oo o--1 ---o     -- 1---
       <2>    oo ---1 o--o     -- 1---
       <3>    ol o--o ---o     -- 1---
       <4>    ol ---o o--o     -- 1---
       <5>    -o o--1 o--o     -- 1---
       <6>    -o 1--o 1--o     -- 1---
       <7>    -1 o--o o--o     -- 1---
       <8>    -1 1--1 1--o     -- 1---
       <9>    1o ---o 1--o     -- 1---
       <10>   1o 1--o ---o     -- 1---
       <11>   11 ---1 1--o     -- 1---
       <12>   11 1--1 ---o     -- 1---
       <1>    oo o--o ----   X -- o---
       <2>    oo ---o o---   X -- o---
       <3>    ol o--1 ----   X -- o---
       <4>    ol ---1 o---   X -- o---
       <5>    -o o--o o---   X -- o---
       <6>    -o 1--1 1---   X -- o---
       <7>    -- ---- ---1   X -- o---
       <8>    -1 o--1 o---   X -- o---
       <9>    -1 1--o 1---   X -- o---
       <10>   1o ---1 1---   X -- o---
```

```
             -- |----
<11>    1o  1+--   ---+  X  --  o---
<12>    11  ---o  1---   X  --  o---
<13>    11  1--o  ----   X  --  o---

<1>     o-  o---  1--o       --  -1--
<2>     o-  1---  o--o       --  -1--
<3>     1-  o---  o--o       --  -1--
<4>     1-  1---  1--o       --  -1--
<1>     o-  o---  o---   X   --  -o--
<2>     o-  1---  1---   X   --  -o--
<3>     --  ----  ---1   X   --  -o--
<4>     1-  o---  1---   X   --  -o--
<5>     1-  1---  o---   X   --  -o--

<1>     --  -oo-  -1-o       --  --1-
<2>     --  -o--  -1oo       --  --1-
<3>     --  -o1-  -o1o       --  --1-
<4>     --  -1o-  -o-o       --  --1-
<5>     --  -1--  -ooo       --  --1-
<6>     --  -11-  -11o       --  --1-
<1>     --  -oo-  -o--   X   --  --o-
<2>     --  -o--  -oo-   X   --  --o-
<3>     --  -o1-  -11-   X   --  --o-
<4>     --  ----  ---1   X   --  --o-
<5>     --  -1o-  -1--   X   --  --o-
<6>     --  -1--  -1o-   X   --  --o-
<7>     --  -11-  -o1-   X   --  --o-

<1>     --  --o-  --1o       --  ---1
<2>     --  --1-  --oo       --  ---1
<1>     --  --o-  --o-   X   --  ---o
<2>     --  ----  ---1   X   --  ---o
<3>     --  --1-  --1-   X   --  ---o  (#pt=76,csum=BBEA)
```

```
               \e:
EQN file : f0evx  \crm\crm2\pal\ptf_lpdm.eqn
          Thu/Oct 13,1994/14:23:49  [eqn2jed ptf_lpdm.eqn]
SRC file : f0evx\e:\crm\crm2\pal\ptf_lpdm.paa
          Thu/Oct 13,1994/14:23:37  [000.00.00-t76m34-BBEA]

chip ptf_lpdm gal22cv10-101(nat)
; ptf_lpdm.c xref: i)nput, r)egistered output, c)ombinatorial output
;--------------------------------------------------------------
;    1---------    cf_carry_1      c4        18
;    -11--------   cf_PDMaccum_h   r3..r2    17,16
;    ---11-----    cf_PDMaccum_l   r1..r0    15,14
;    -----11---    locnt_h         i4..i3    7,8
;    -------11-    locnt_l         i2..i1    9,10
;    ---------1    reset           i0        11
;---9876543210-------------------------------------------------
;    1-----        PDM_out         r5        19
;    -1----        carry_1         c4        18
;    --11--        PDMaccum_h      r3..r2    17,16
;    ----11        PDMaccum_l      r1..r0    15,14
;--------------------------------------------------------------
; pin    1    2    3    4    5    6    7    8    9    10   11   12
         ck   i9   i8   i7   i6   i5   i4   i3   i2   i1   i0   gnd ; pin   13   14   15   16   17   18   19   20   21   22   23   24
        i10  r0   r1   r2   r3   c4   r5   r6   r7   r8   r9   vcc
;--------------------------------------------------------------
equations r5   :=    r2  *  i4  *  i3  * /i0
     +     r3  *  i4  * /i0
     +     r3  *  r2  *  i3  * /i0
     +     c4  *  i4  *  i3  * /i0
     +     c4  *  r2  *  i4  * /i0
     +     c4  *  r3  *  i3  * /i0
     +     c4  *  r3  *  r2  * /i0 c4   =     r0  *  i2  *  i1  * /i0
     +     r1  *  i2  * /i0
     +     r1  *  r0  *  i1  * /i0 r3   :=   /c4  * /r3  * /r2  *  i4  * /i0
     +    /c4  * /r3  *  i4  * /i3  * /i0
     +    /c4  *  r3  * /r2  * /i4  * /i0
     +    /c4  *  r3  *  /i4 * /i3  * /i0
     +    /r3  * /r2  *  i4  * /i3  * /i0
     +    /r3  *  r2  * /i4  *  i3  * /i0
     +     r3  * /r2  * /i4  * /i3  * /i0
     +     r3  *  r2  *  i4  *  i3  * /i0
     +     c4  * /r3  * /i4  *  i3  * /i0
     +     c4  * /r3  *  r2  * /i4  * /i0
     +     c4  *  r3  *  i4  *  i3  * /i0
     +     c4  *  r3  *  r2  *  i4  * /i0 r2   :=   /c4  * /r2  *  i3  * /i0
     +    /c4  *  r2  * /i3  * /i0
     +     c4  * /r2  * /i3  * /i0
     +     c4  *  r2  *  i3  * /i0
``` ptf_lpdm.eqn

```
r1  :=  /r1  *  /r0  *   i2  *  /i0
     +  /r1  *   i2  *  /i1  *  /i0
     +  /r1  *   r0  *  /i2  *   i1  *  /i0
     +   r1  *  /r0  *  /i2  *  /i0
     +   r1  *  /i2  *  /i1  *  /i0
     +   r1  *   r0  *   i2  *   i1  *  /i0 r0  :=  /r0  *   i1  *  /i0
     +   r0  *  /i1  *  /i0

;eqnfile checksum : F05A
```

```c
#include "romwcsc
         romwcsc.h"
char *s[]={ "ev / ptf_hpdm",
          - "Pal=GAL22CV10-10L(Nat), Addbit=4, Datbit=10",
          - "rev 0 / Oct 12,1994  Wong Hee",
          - "rev 0 / Oct 12,1994" };

/* eqnfile phin assignment: i)nput, r)egistered op, c)ombinatorial op
   ("   1   2   3   4   5   6   7   8   9  10  11   12 "}
   {"  ck  i9  i8  i7  i6  i5  i4  i3  i2  i1  i0  gnd "}
   {"  13  14  15  16  17  18  19  20  21  22  23   24 "}
   {" i10  r0  r1  r2  r3  r4  r5  r6  r7  r8  r9  vcc "}
*/

UL hicnt_dly,PDM_in,dummy;
UL PDM__3,PDM__2,PDM__1;
UL add2_3,add2_2,add2_1;
UL add1_3,add1_2,add1_1;

int  main(void);
void logic(void);
int  chk_valid_get_3phase(UL,UL *,UL *,UL *);
void decode_inv_add2_add1(UL,UL *,UL *,UL *);

UL  address,addrtop,rdata;
int addb,datb;

/* main ************************************************** FUNCTION */
int main()
{ time(&TIMESTAMP);
. hkeep(s[0],s[1],s[2],s[3],&addrtop,&addb,&datb);
.
. for (address=0; address<=addrtop; address++)
.            /* address bits  "5432109876543210" */
. { define_input_vector(address, "-------------111-", &hicnt_dly    );
. . define_input_vector(address, "----------------1", &PDM_in       );
. . logic(); rdata=(UL)0;
. .
. .          /*    data bits  "5432109876543210" */
. . define_output_vector(&rdata, "-----1----------", PDM__1        );
. . define_output_vector(&rdata, "--------1-------", PDM__2        );
. . define_output_vector(&rdata, "---------1------", PDM__3        );
. . define_output_vector(&rdata, "----------1-----", add1_1        );
. . define_output_vector(&rdata, "-----------1----", add1_2        );
. . define_output_vector(&rdata, "------------1---", add1_3        );
. . define_output_vector(&rdata, "-------------1--", add2_1        );
. . define_output_vector(&rdata, "--------------1-", add2_2        );
. . define_output_vector(&rdata, "---------------1", add2_3        );
. . define_output_vector(&rdata, "----------------1", dummy        );
. . store_rdata(address,rdata);
. }
. write_rdata_cleanup(); return(0);
}

/* logic ************************************************** FUNCTION */
void logic()
```

```
{ UL phse1,phse2,phse3,invt_3,invt_2,invt_1;
. dummy=0;
. PDM__3 = PDM__2 = PDM__1 = 0;
. add2_3 = add2_2 = add2_1 = 0;
. add1_3 = add1_2 = add1_1 = 0;
.
. if (!chk_valid_get_3phase(hicnt_dly,&phse1,&phse2,&phse3)) {
. . PDM__3 = PDM__2 = PDM__1 = dcare("-"); /* invalid, output don't care */
. . add2_3 = add2_2 = add2_1 = dcare("-");
. . add1_3 = add1_2 = add1_1 = dcare("-");
. .
. } else { /* valid hicnt_dly */
. . decode_inv_add2_add1(phse1,&invt_1,&add2_1,&add1_1);
. . decode_inv_add2_add1(phse2,&invt_2,&add2_2,&add1_2);
. . decode_inv_add2_add1(phse3,&invt_3,&add2_3,&add1_3);
. .
. . PDM__1 = invt_1 ^ PDM_in;
. . PDM__2 = invt_2 ^ PDM_in;
. . PDM__3 = invt_3 ^ PDM_in;
. }
. return;
}

/* chk_valid_get_3phase ***************************************** FUNCTION */
int chk_valid_get_3phase(phsein,phse1,phse2,phse3)
UL  phsein,*phse1,*phse2,*phse3;
{ int valid;
. UL phin;
.
. switch (phsein) /* check invalid phsein */
. { default: phin=0; valid=0; break;
. .
. . case 0:  phin=0; valid=1; break; /* counting seq: 0,1,2,3,4,5,0,... */
. . case 1:  phin=1; valid=1; break;
. . case 2:  phin=2; valid=1; break;
. . case 3:  phin=3; valid=1; break;
. . case 4:  phin=4; valid=1; break;
. . case 5:  phin=5; valid=1; break;
. . case 6:  phin=0; valid=0; break;
. . case 7:  phin=0; valid=0; break;
. }
.
. if (valid)
. { *phse1 = phin + 0;              /* add offset for phse1 */
. . if (*phse1 >= 6) { *phse1-=6; } /* wrap arround          */
. .
. . *phse2 = phin + 2;              /* add offset for phse2 */
. . if (*phse2 >= 6) { *phse2-=6; } /* wrap arround          */
. .
. . *phse3 = phin + 4;              /* add offset for phse3 */
. . if (*phse3 >= 6) { *phse3-=6; } /* wrap arround          */
. }
. return(valid);
}
```

```
/* decode_inv_add2_add1 ***************************************** FUNCTION */
void decode_inv_add2_add1(phse,invt,add2,add1)
UL phse,*invt,*add2,*add1;
{
.   *invt = ((phse>=3)&&(phse<=5)) ? (1) : (0);
.   *add2 = ((phse>=2)&&(phse<=3)) ? (1) : (0);
.   *add1 = ((phse>=1)&&(phse<=4)) ? (1) : (0);
.   return;
}
```

```
              e:\crm
PAL map : f0evx\e    rm\crm2\pal\ptf_hpdm.paa
          Mon/Oct 17,1994/17:31:27   [000.00.00-t47md2-2FB4]
SRC file : f0evx\e:\crm\crm2\pal\ptf_hpdm.rom     m22
          pal=gal22cv10-101(nat), addbit=4, datbit=10
          rev 0 / Oct 12,1994  Wong Hee
          rev 0 / Oct 12,1994
          Mon/Oct 17,1994/17:31:20
          imsk: 11 1ooo 111o
    pt#  (A)3210  (D)98 7654 3210
    <1>   oo-1    1-   ---- ----
    <2>   -1o1    1-   ---- ----
    <3>   -11o    1-   ---- ----
    <4>   1--o    1-   ---- ----

<1>   o-1o   -1   ---- ----
    <2>   -oo1   -1   ---- ----
    <3>   -1-o   -1   ---- ----
    <4>   1--1   -1   ---- ----

<1>   oo-o   -- 1--- ----
    <2>   -1-1   -- 1--- ----
    <3>   1-o1   -- 1--- ----
    <4>   1-1o   -- 1--- ----

<1>   ooo-   -- -o-- ----
    <2>   1-1-   -- -o-- ----

<1>   -11-   -- --o- ----
    <2>   1-o-   -- --o- ----

<1>   oo1-   -- ---o ----
    <2>   -1o-   -- ---o ----

<1>   o1--   -- ---- 1---

<1>   oo--   -- ---- -1--

<1>   1o--   -- ---- --1-

<1>   ----   -- ---- ---o  (#pt=47,csum=2FB4)
```

1e        ptf_hpdm.paa

```
                    \e:
EQN file : f0evx   \crm\crm2\pal\ptf_hpdm.eqn
           Mon/Oct 17,1994/17:31:32   [eqn2jed ptf_hpdm.eqn]
SRC file : f0evx\e:\crm\crm2\pal\ptf_hpdm.paa
           Mon/Oct 17,1994/17:31:27   [000.00.00-t47m22-2FB4]

chip ptf_hpdm gal22cv10-101(nat)
; ptf_hpdm.c xref: i)nput, r)egistered output, c)ombinatorial output
; ------------------------------------------------------------
;           111-     hicnt_dly   i3..i1    8,9,10
;           ---1     PDM_in      i0        11
;---9876543210---------------------------------------
;   1---------       PDM_1       r9        23
;   -1--------       PDM_2       r8        22
;   --1-------       PDM_3       r7        21
;   ---1------       add1_1      r6        20
;   ----1-----       add1_2      r5        19
;   -----1----       add1_3      r4        18
;   ------1---       add2_1      r3        17
;   -------1--       add2_2      r2        16
;   --------1-       add2_3      r1        15
;   ---------1       dummy       r0        14
;------------------------------------------------------------
; pin    1    2    3    4    5    6    7    8    9    10   11   12
         ck   i9   i8   i7   i6   i5   i4   i3   i2   i1   i0   gnd ; pin    13   14   15   16   17   18   19   20   21   22   23   24
         i10  r0   r1   r2   r3   r4   r5   r6   r7   r8   r9   vcc
;------------------------------------------------------------
equations r9  :=  /i3  *  /i2  *   i0
       +   i2  *  /i1  *   i0
       +   i2  *   i1  *  /i0
       +   i3  *  /i0 r8  :=  /i3  *   i1  *  /i0
       +  /i2  *  /i1  *   i0
       +   i2  *  /i0
       +   i3  *   i0 r7  :=  /i3  *  /i2  *  /i0
       +   i2  *   i0
       +   i3  *  /i1  *   i0
       +   i3  *   i1  *  /i0

/r6  :=  /i3  *  /i2  *  /i1
       +   i3  *   i1

/r5  :=   i2  *   i1
       +   i3  *  /i1

/r4  :=  /i3  *  /i2  *   i1
       +   i2  *  /i1 r3  :=  /i3  *   i2 r2  :=  /i3  *  /i2
```

```
 r1   :=    i3   *  /i2

/r0   :=   vcc

;eqnfile checksum : 6AD7
```

What is claimed is:

1. A phase-to-phase frequency (P-to-F) converter that converts a digital phase error signal that indicates positive and negative phase errors into a plurality of phase-separated triangular waveforms, the P-to-F converter comprising:

an up/down counter that counts the positive and negative phase errors and generates a multibit, parallel digital counter output signal that indicates a cumulative current value of the phase errors, the counter output signal including a least significant bit (LSB) portion and a most significant bit (MSB) portion;

a pulse density modulator (PDM) that converts the LSB portion of the counter output signal to a corresponding serial, digital PDM signal; and a multi-phase triangular wave synthesizer that combines the MSB portion of the counter output signal and the PDM signal to provide a plurality of DC-modulated, phase-separated triangular waveforms, the multi-phase triangular wave synthesizer being driven by periodic counts of a clock signal and responding to the MSB portion of the counter output signal and the PDM signal to provide, for each of a plurality of phase-separated output signals of the wave synthesizer, (i) a PDM output waveform with polarity information, (ii) a first switching signal for modulating the PDM output waveform on first specified counts of the clock signal, and (iii) a second switching signal for modulating the PDM output waveform on second specified counts of the clock signal, and for each phase-separated output signal of the wave synthesizer, output filter circuitry that responds to the PDM output waveform and the first and second switching waveforms of said phase-separated output by providing a corresponding analog output signal.

2. A phase-to-frequency (P-to-F) converter that converts a digital plus/minus phase error input signal that indicates positive and negative phase errors into a plurality of phase-separated triangular waveforms, the P-to-F converter comprising:

a counter system that includes both a lower LSB binary up/down counter section that receives the phase error input signal and generates a multi-bit LSB output and a carry output signal and an upper MSB binary up/down counter that receives the phase error input signal and the carry output signal and generates multi-bit MSB output;

a lower multi-bit PDM circuit that includes a multi-bit adder that receives the LSB output of the counter system and a multi-bit register that receives an output of the multi-bit adder such that the lower multi-bit PDM circuit adds previous contacts of the multi-bit register to a current value of the LSB output to provide a PDM carry output signal;

a multi-bit upper PDM circuit that responds to the MSB output and the PDM carry output signal a plurality of phase separated output signals; and for each phase separated output signals, LC filter circuitry that converts said phase separated output signals to a corresponding analog output signal.

3. A phase-to-frequency (P-to-F) converter that converts a digital plus/minus phase error input signal that indicates positive and negative phase errors into three phase-separated triangular waveforms, the P-to-F converter comprising:

a counter system that includes a lower 4-bit LSB binary up/down counter and an upper 3-bit MSB binary up/down counter that counts from count 0 to count 5, and wherein the lower counter receives the phase error input signal and generates a 4-bit lower LSB output count signal and a LSB carry output signal, and wherein the upper counter receives the phase error input signal and the LSB carry output signal and generates a 3-bit upper MSB output count signal representing count 0 to count 5;

a lower PDM circuit that includes a 4-bit adder that receives the 4-bit lower LSB output count signal and a 5-bit register, the output of the 4-bit adder being connected to the input of the 5-bit register such that the lower PDM circuit adds the previous contents of the register to the current value of the 4-bit lower LSB output count signal to provide a lower PDM carry output signal;

an upper PDM circuit that is driven by periodic counts of a clock signal and that responds to the 3-bit upper MSB output count signal and the lower PDM carry output signal to provide, for each of three phase-separated output signals of the upper PDM circuit, (i) an output waveform PDM with polarity information, (ii) a first switching signal add1_n that modulates the PDM output waveform on first specified counts of the clock signal, and (iii) a second switching signal add2_n that modulates the PDM output waveform on second specified counts of the clock signal; and for each phase-separated output signal of the wave synthesizer, output filter circuitry that responds to the PDM output waveform and the first and second switching waveforms of said phase-separated output by providing a corresponding analog output signal.

4. A P-to-F converter as in claim 3 and wherein the upper PDM circuit includes a decoder that decodes the count 0 to count 5 provided by the upper MSB counter in accordance with the following logic equations $$add1\_1=((count>=1)\&\&(count<=4))\ ?(1):(0)$$

$$add2\_1=((count>=2)\&\&(count<=3))\ ?(1):(0)$$

$$PDM\_1=invt*PDM\_out$$

$$invt=((count>=3)\&\&(count<=5))\ ?(1):(0)$$

such that, for each PDM output waveform n, the first switching signal add1_n is asserted during counts 1, 2, 3 and 4, the second switching signal add$_2$_n is asserted during counts 2 and 3, the PDM output waveform is the output signal during counts 0, 1 and 2, and during counts 3, 4 and 5, the PDM output waveform is inverted.

* * * * *

UNITED STATES PATENT AND TRADEMARK OFFICE
CERTIFICATE OF CORRECTION

PATENT NO. : 5,646,967
DATED : July 8, 1997
INVENTOR(S) : Wong Hee et al.

It is certified that error appears in the above-indentified patent and that said Letters Patent is hereby corrected as shown below:

In Col. 56, line 55, delete "$add_2\_n$" and replace with --add2_n--.

Signed and Sealed this

Twenty-sixth Day of August, 1997

BRUCE LEHMAN

Attest:

Attesting Officer

Commissioner of Patents and Trademarks